United States Patent
Uehling

(10) Patent No.: US 9,466,544 B2
(45) Date of Patent: Oct. 11, 2016

(54) SEMICONDUCITIVE CATECHOL GROUP ENCAPSULANT ADHESION PROMOTER FOR A PACKAGED ELECTRONIC DEVICE

(71) Applicant: Trent S. Uehling, New Braunfels, TX (US)

(72) Inventor: Trent S. Uehling, New Braunfels, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 13/754,086

(22) Filed: Jan. 30, 2013

(65) Prior Publication Data

US 2014/0210063 A1    Jul. 31, 2014

(51) Int. Cl.

| | |
|---|---|
| *H01L 23/495* | (2006.01) |
| *H01L 23/28* | (2006.01) |
| *H01L 23/29* | (2006.01) |
| *H01L 23/48* | (2006.01) |
| *H01L 23/52* | (2006.01) |
| *H01L 29/40* | (2006.01) |
| *H01L 21/56* | (2006.01) |

(52) U.S. Cl.
CPC .............. *H01L 23/28* (2013.01); *H01L 21/56* (2013.01); *H01L 2224/32225* (2013.01); *H01L 2224/48091* (2013.01); *H01L 2224/48227* (2013.01); *H01L 2224/73265* (2013.01); *H01L 2224/8592* (2013.01)

(58) Field of Classification Search
CPC ... H01L 23/28; H01L 21/56; H01L 31/0203; H01L 31/048; H01L 33/52; H01L 23/49503; H01L 23/49506; H01L 23/4951; H01L 23/49513; H01L 33/62; H01L 23/29; H01L 23/3164; H01L 31/0481; H01L 31/0488

USPC ....... 257/787, 676, 788, 791, 792, 793, 784, 257/786
See application file for complete search history.

(56) References Cited

U.S. PATENT DOCUMENTS

| | | |
|---|---|---|
| 4,281,090 A | 7/1981 | Craig |
| 2006/0082021 A1 | 4/2006 | Williams et al. |
| 2007/0262426 A1* | 11/2007 | Mahler .......................... 257/669 |
| 2008/0001264 A1 | 1/2008 | Lange |
| 2008/0216921 A1 | 9/2008 | Kwan et al. |
| 2010/0062570 A1 | 3/2010 | Test |
| 2011/0064881 A1 | 3/2011 | Zimmerman et al. |

OTHER PUBLICATIONS

Banda et al.; "Direct Au and Cu wire bonding on Cu/Low-k BEOL"; 2002 Electronics Packaging Technology Conference; 2002; pp. 344-349; IEEE.
Glodde et al.; "Adhesion promotors for gold: Bis-(w-aminoalkyl)—disulfides:"; International Journal of Adhesion & Adhesives; Oct. 1998k; pp. 359-364; vol. 18, No. 5; Elsevier.
Laibinis; "Comparison of the Structures and Wetting Properties of Self-Assembled Monolayers of n-Alkanethiols on the Coinage Metal Surfaces, Cu, Ag, Au"; Journal of the American Chemical Society; 1991; pp. 7152-7167; 113; American Chemical Society.
Subramanian et al.; "Self Assembled Monolayers of Alkanethiols on Silver Surfaces"; Journal of the Indian Institute of Science; Jan.-Mar. 2009; pp. 1-7; vol. 89:1.
Sung et al.; "Self Assembled Monolayers of Alkanethiols on Oxidized Copper Surfaces"; Journal of Physical Chemistry; 2000; pp. 2273-2277; 104; American Chemical Society.

(Continued)

*Primary Examiner* — Yu Chen
*Assistant Examiner* — Dilinh Nguyen

(57) ABSTRACT

A packaged electronic device includes a package substrate, an electronic component die mounted to the package substrate, and an encapsulant bonded to a portion of the package substrate at a catechol group adhesion promoted interface that includes benzene rings bonded with the package substrate and the encapsulant.

11 Claims, 4 Drawing Sheets

(56) References Cited

OTHER PUBLICATIONS

Whelan et al.; "Corrosion Inhibition by Thiol-Derived SAMs for Enhanced Wire Bonding on Cu Surfaces"; Journal of the Electrochemical Society; 2004; pp. B33-B38; 151 (2); The Electrochemical Society Inc.

Whelan et al.; "In-Situ Cleaning and Passivation of Oxidized Cu Surfaces by Alkanethiols and Its Application to Wire Bonding"; 2004; Journal of Electronic Materials; pp. 1005-1011; vol. 33, No. 9.

Wong et al.; "A New Approach in Measuring Cu-EMC Adhesion Strength by AFM"; 2004 Electronic Components and Technology Conference; 2004; pp. 491-495; IEEE.

Wikipedia entry for CATECHOL downloaded Oct. 4, 2012; 6 pages; Wikipedia.

Silverman et al.; "Understanding Marine Mussel Adhesion"; Marine Biotechnology Review; Nov. 8, 2007; pp. 661-681; vol. 9; Springer Science+Business Media, LLC.

Ye et al.; "Boinspired catecholic chemistry for surface modification"; Chemical Society Review; 2011; pp. 4244-4258; 40; Royal Society of Chemistry.

\* cited by examiner

SEMICONDUCITIVE CATECHOL GROUP ENCAPSULANT ADHESION PROMOTER FOR A PACKAGED ELECTRONIC DEVICE

BACKGROUND OF THE INVENTION

1. Field of the Invention

This invention relates in general to packaged electronic devices, and in particular, to catechol group adhesion promoters for packaged electronic devices.

2. Description of the Related Art

A packaged electronic device typically includes a semiconductor die or other electronic component that is attached to a package substrate and encapsulated with an encapsulant to provide protection to the electronic component, e.g. during usage in an electronic system.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

In some environments such as automotive or industrial environments, encapsulant adhesion to a package substrate (e.g. a lead frame) can be challenging. High shear stress, degradation of adhesion strength due to moisture absorption and high temperatures, and variation in lead frame finishes can contribute to compromised adhesion between the package substrate and the encapsulant.

As described below, a catechol group adhesion promoter is used for promoting adhesion between an encapsulant and a package substrate in a packaged electronic device. In some examples, the applied adhesion promoter molecules form bonds with molecules of the encapsulant and molecules of the substrate to improve adhesion of the encapsulant to the substrate.

Figure 1:
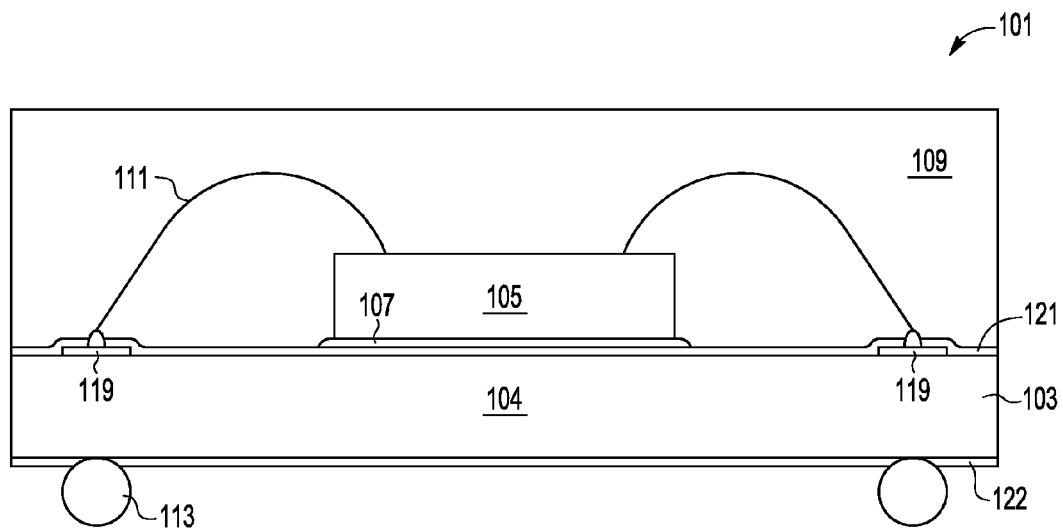
FIG. 1 is a partial cross-sectional side view of a packaged electronic device according to one embodiment of the present invention.

FIG. 1 is a cross-sectional side view of a packaged electronic device 101 according to one embodiment of the present invention. Device 101 includes a package substrate 103 and a die 105 attached to substrate 103 with die adhesive 107. In the embodiment shown, the package substrate includes a dielectric carrier 104 with conductive structures (e.g. bond pads 119) located thereon and conductive layers and vias (not shown) located therein. In other embodiments, a package substrate may be a lead frame (either a leaded or leadless) which is made of a metal material (e.g. copper). Still in other embodiment, a package substrate may have other structures and/or be made of other materials.

In the embodiment shown, die 105 is a segment of a semiconductor wafer that has been processed with dielectric, semiconductive, and conductive materials to form circuitry. In one embodiment, die 105 includes digital circuitry such as a processor, but may include other types of circuitry such as e.g. analog circuitry, memory, and/or logic gates. In some embodiments, the wafer may be made of silicon, silicon germanium, a III-V semiconductor material, or other types of semiconductor material. In other embodiments, other types of electronic components (e.g. stand alone capacitors, transistors, and inductors) may be encapsulated in a packaged electronic device. In one embodiment, a packaged electronic device may include multiple electronic components such as multiple die or a die and a capacitor.

Die 105 and substrate 103 are encapsulated with encapsulant 109. In one embodiment, encapsulant 109 is an epoxy mold compound that includes e.g. bisphenol-a or phenolic resin. In other embodiments other types of encapsulants may be used, e.g. such as anhydride, novolac, phenolic, and unsaturated polyester.

In the embodiment shown, conductive structures (not shown) of die 105 are coupled with wires 111 to conductive structures (e.g. pads 119) of substrate 103. These wires are attached to conductive structures of die 105 and substrate 103 by a wire bonding process. In other embodiments, die 105 may be electrically coupled to substrate 103 in other ways, e.g. with conductive traces. Die 105 may also be attached to substrate 103 in an upside down configuration wherein the conductive structures of the die are attached to conductive structures of the substrate such as in a flip chip configuration.

Device 101 includes solder balls 113 for external electrical coupling to other devices in an electronic system. Solder balls 113 are electrically coupled to pads 119 by conductive layers and vias (not shown) located within carrier 104. In other embodiments, device 101 may include other types of external conductors such as leads or pads.

In the embodiment shown, the packaged electronic device is a ball grid array package. However in other embodiments, device 101 may be of another electronic packaging configuration type such as e.g. a QFN configuration type, a leaded configuration type (e.g. through hole or surface mount), a QFP configuration type, or an SoIC configuration type.

Device 101 includes a catechol group adhesion promoted interface 121. A catechol group adhesion promoted interface is an interface between two structures that is formed from the application of a catechol group adhesion promoter applied between the two structures for forming bonds between the two structures. In the embodiment shown, interface 121 is formed by the application of a layer of a catechol group adhesion promoter applied between substrate 103 and encapsulant 109 for forming chemical bonds between encapsulant 109 and substrate 103, and also for forming chemical bonds between substrate 103 and die adhesive 107. Interface 121 includes molecules with benzene rings formed from a reaction of the promoter and substrate molecules and the promoter and encapsulant molecules.

A catechol group adhesion promoter is an adhesion promoter that includes catechol molecules and/or catechol derivative molecules. Catechol is also known as 1,2, dihydroxybenzene or pyrocatechol. A catechol derivative is a substance having a molecule that includes a benzene ring and at least two hydroxyl groups bonded to the ring.

Figure 5:
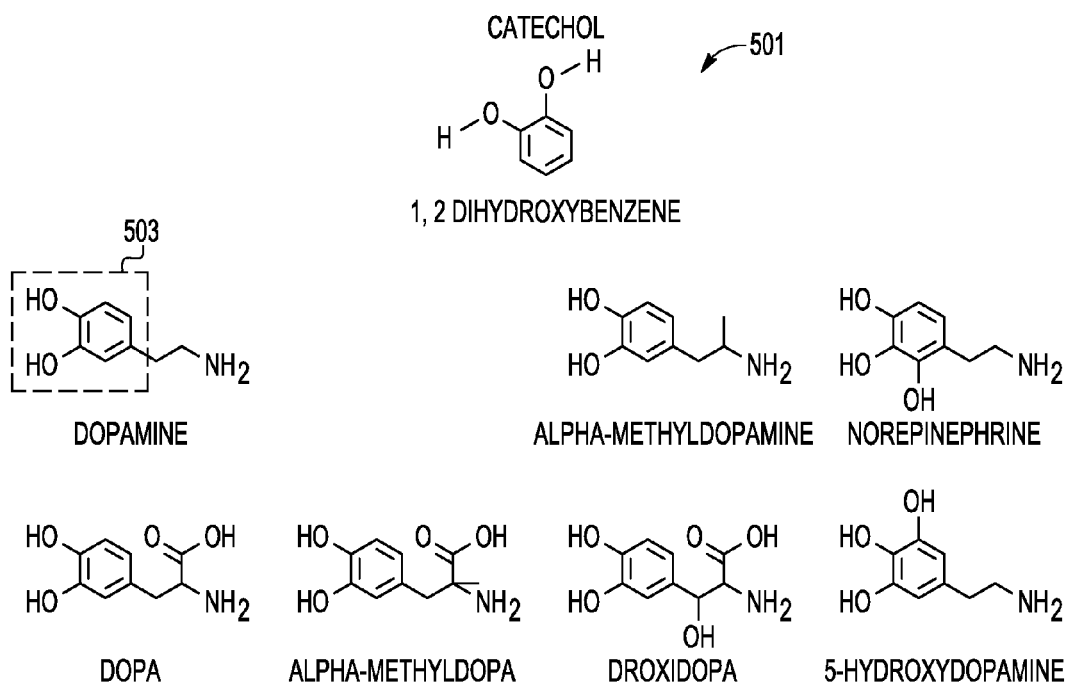
FIG. 5 is sets forth molecular models of catechol group molecules according to one embodiment of the present invention.

FIG. 5 sets forth molecular models of catechol and various catechol derivatives. Model 501 is a model of a catechol molecule. Models for dopamine, alpha-methyldopamine, norepinephrine, dihydroxyphenylalanine (DOPA), alpha-methyldopa, droxidopa, and 5-hydroxydopamine molecules are also shown in FIG. 5. In the dopamine molecule shown in FIG. 5, box 503 is drawn around the benzene ring and two hydroxyls ("HO") bonded to the ring.

Referring back to FIG. 1, interface 121 is shown as being located on substrate 103. Interface 121 includes one or more layers of molecules that are bonded to molecules of the structures on either side of the interface. In the embodiment of FIG. 1, the adhesion promoter is applied to substrate 103 prior to the attachment of die 105. Consequently interface 121 is shown as being located beneath adhesive 107. The chemical makeup of interface 121 at a particular location is dependent on the materials on either side of interface 121. For example, the chemical makeup of interface 121 beneath adhesive 107 may be different than that between encapsulant 109 and substrate 103. Furthermore, where substrate 103 has multiple materials at its top surface (e.g. both dielectric and metal), the chemical makeup of interface 121 would be different at different locations as well. In some embodiments, interface 121 may also include unreacted catechol group molecules.

In the embodiment of FIG. 1, the adhesion promoter interface is not located on the wire bonds of pads 119. This is due in some embodiment to the pads being scrubbed prior to wirebonding which removes the interface molecules.

In FIG. 1, interface 121 is shown as being thicker than it actually is relative to other structures of device 101. This is done in the figures to illustrate the location of interface 121. In some embodiments, interface 121 may only be one molecule thick or a few molecules thick.

In one embodiment, the adhesion promoter includes other substances in addition to the catechol group molecules. For example, the promoter may include a fluorinated copolymer that aids in the adhesion reaction with some materials such as metals (e.g. copper). The promoter may include sodium bisulfate.

In one embodiment, the substances (including the promoter) are dissolved in an aqueous buffer solution such as an aqueous hydrochloride for its application to the substrate. In another embodiment, the substances (including the promoter are dissolved in ethanol. In one embodiment, the promoter is applied to substrate 103 by immersing the substrate in the promoter solution. In one embodiment, the solution is heated during the immersion process. During the immersion process, the promoter reacts with the surface of the substrate to form chemical bonds between the benzene rings of the promoter and molecules of the substrate. The resultant molecules may also have a free hydroxyl that will aid in subsequent bonding to the encapsulant. Because the entire panel is immersed in some embodiments, substrate 103 includes a layer 122 of material that includes molecules with benzene rings on the bottom of the substrate 103. In one embodiment, the material formed from the reaction of the adhesion promoter with the surfaces of the substrate is characterized as a self assembled monolayer, which is molecular assembly formed spontaneously on a surface by adsorption.

In the embodiment shown, substrate 103 was part of a panel of packaged substrates when immersed. After die attachment, wirebonding, and encapsulation, the panel is separated into multiple packages. Thus, in the embodiment shown, no adhesion promoter material is located on the side of device 101.

Figure 6:
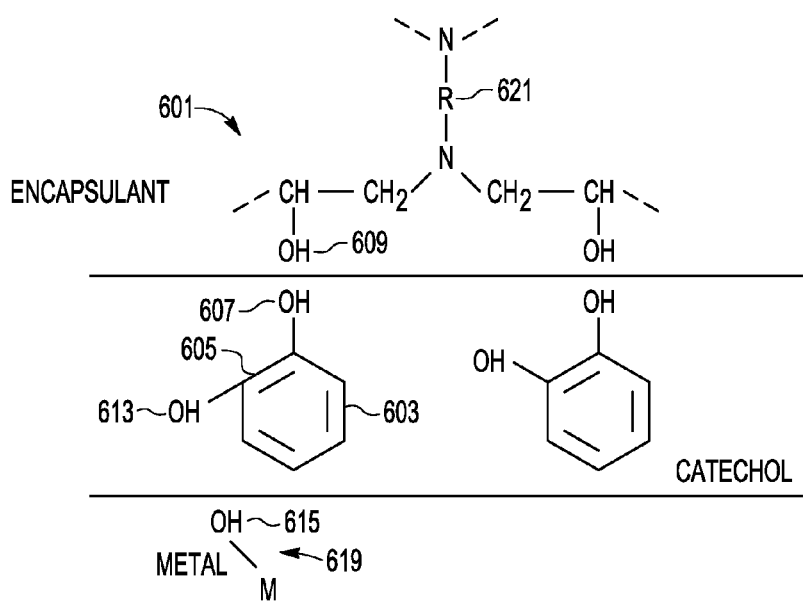
FIG. 6 is a molecular model showing a molecular structure of an encapsulant, adhesion promoter, and substrate structure prior to a chemical reaction according to one embodiment of the present invention.
Figure 7:
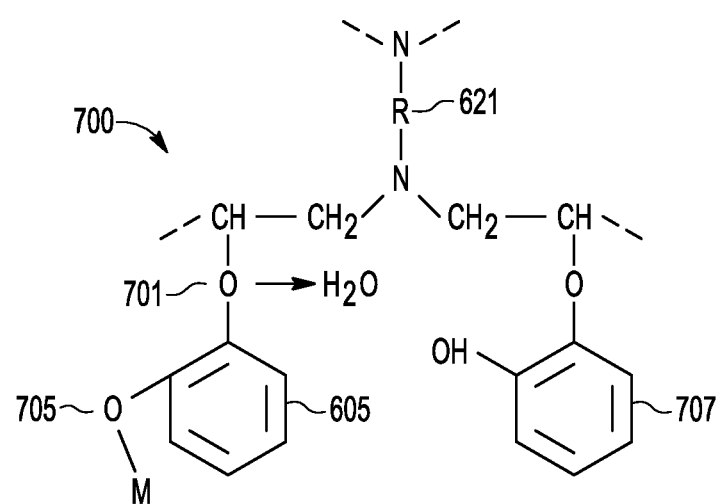
FIG. 7 is a molecular diagram model showing a molecular structure of an encapsulant, adhesion promoter, and substrate structure after a chemical reaction according to one embodiment of the present invention.

FIGS. 6 and 7 show molecular models illustrating the molecules of the promoter, substrate, and encapsulant and their reaction to each other.

FIG. 6 shows a model for a catechol molecule 603 in proximity to a model for encapsulant molecule 601 and in proximity to a model for a metal molecule 619 of a substrate. In some embodiments, this state of the molecules may not actually exist in that the adhesion promoter first bonds to the substrate material during its application and then bonds to the encapsulant during the encapsulation process. However, FIG. 6 is being shown to illustrate the chemical processes involved in the chemical bonding.

The encapsulant molecule 601 includes nitrogen, CH, $CH_2$, and hydroxyls (e.g. hydroxyl 609). The "R" of molecule 601 represents any chemical molecule of the encapsulant material. The complete structure of molecule 601 is not shown in FIG. 6 in that CH, $CH_2$, and hydroxyls are located above the top nitrogen element in FIG. 6. The "M" in molecule 619 represents any metal molecule (e.g. copper). Molecule 619 includes a hydroxyl 615. Catechol molecule 603 includes benzene ring 605 and hydroxyls 607 and 613.

FIG. 7 shows a model of a molecule 700 of a catechol adhesion promoted interface wherein the catechol molecule 603 has reacted with metal molecule 619 and reacted with encapsulant molecule 601 to form a resultant molecule 700. In forming molecule 700, metal molecule 619 is chemically bonded to benzene ring 605 with an oxygen chemical covalent bond 705 and encapsulant molecule 601 is bonded to ring 605 with an oxygen chemical covalent bond 701. During the chemical reactions, hydroxyl 615 of metal molecule 619 reacts with hydroxyl 613 of catechol molecule 603 to form oxygen bond 705 and a water molecule. Also during the reactions, hydroxyl 609 reacts with hydroxyl 607 to form oxygen bond 701 and a water molecule. Resultant molecule 700 includes material from an encapsulant molecule 601, an adhesion promoter molecule 603, and a substrate molecule 619. Accordingly, the resultant molecules provide for a stronger bond between the encapsulant and the substrate. During the encapsulation process, the water molecules are removed by out gassing.

In some embodiments, not all of the catechol group molecules of a catechol group adhesion promoter chemically bond to both the substrate molecules and the encapsulant molecules. For example, in FIG. 7, benzene ring 707 is only chemically bonded to material of the encapsulant layer and not material of the substrate. In other embodiments, some benzene rings of an interface would only be chemically bonded to molecules of the substrate. Still in other embodiments, the interface would include catechol group molecules that are unreacted with either encapsulant molecules or substrate molecules.

In other embodiment, the molecules may be bonded together by other types of chemical bonds other than the oxygen covalent bonds shown in FIG. 7. For example, the benzene ring may be bonded to either molecules of the encapsulant or molecules of the substrate with a hydrogen or ionic bond. In other embodiments, the benzene rings of an interface layer maybe interconnected with each other with carbon bonds to form a honeycomb like structure. In one embodiment, the resultant molecules of the interface form a self assembled monolayer.

Figure 2:
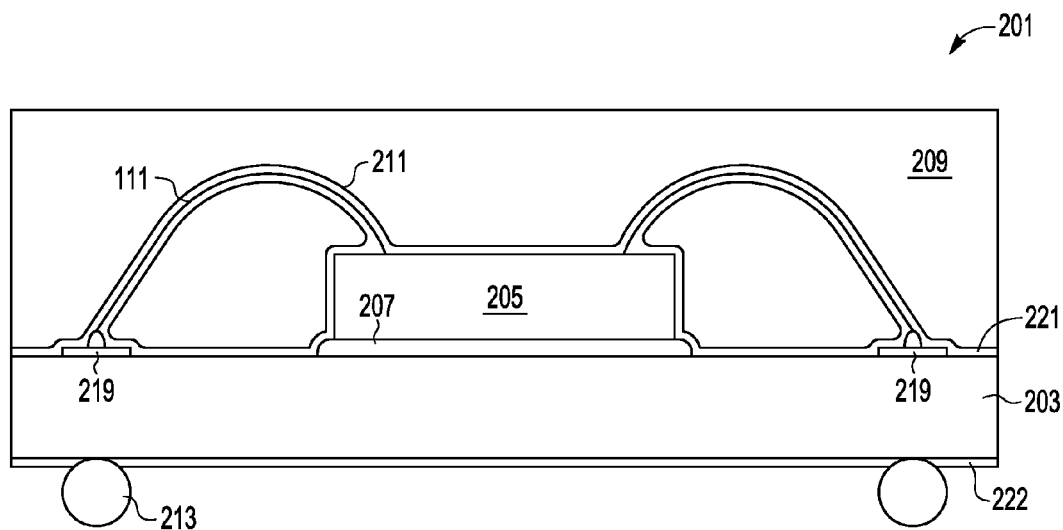
FIG. 2 is a partial cross-sectional side view of a packaged electronic device according to another embodiment of the present invention.

FIG. 2 is a cross sectional side view of a packaged electronic device according to another embodiment of the present invention. Packaged device 201 is similar to packaged device 101 except that the adhesion promoter is applied after wiring bonding with the embodiment of FIG. 2. Otherwise, substrate 203, adhesive 207, die 205, encapsulant 209, pads 219, wires 211, and solder balls 213 are similar to substrate 103, adhesive 107, die 105, encapsulant 109, pads 119, wires 111, and solder balls 113 of FIG. 1.

In the embodiment of FIG. 2, because the adhesion promoter is applied to substrate 203 after the attachment of die 205 and after wire bonding, the adhesion promoter is applied to the surfaces of die 205 and wires 211. Accordingly, interface 221 is located at the surfaces of the wires and dies 205 where the encapsulant chemically bonds with the metal of wires 211 and the surface of die 205. Also, material 222 is formed by the application of catechol group adhesion promoter to the bottom of substrate 203.

Figure 3:
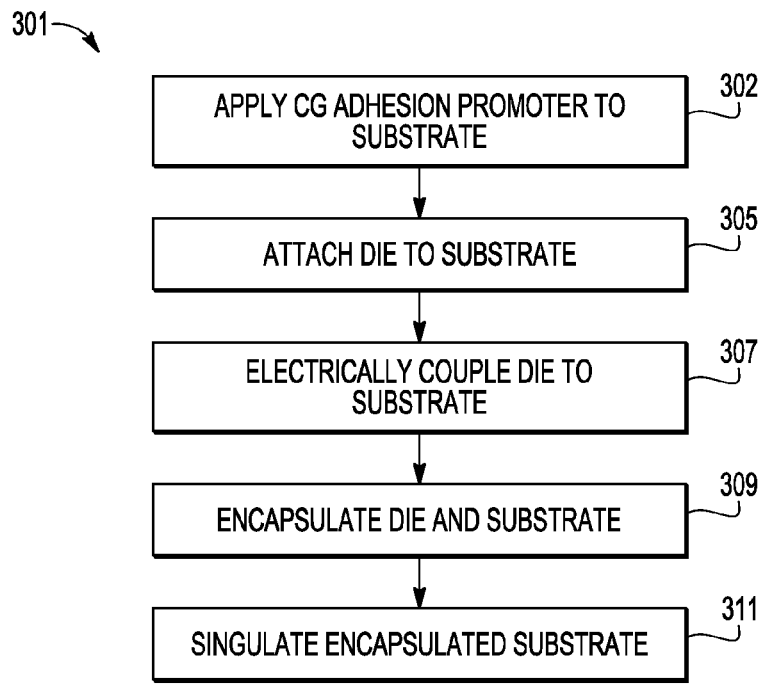
FIG. 3 is a flow chart for forming a packaged electronic device according to one embodiment of the present invention.

FIG. 3 sets forth a flow diagram 301 for making a packaged electronic device similar to device 101. In process 303, an adhesion promoter is applied to a substrate panel. In one embodiment, the adhesion promoter is applied by immersing a multi substrate panel in a liquid containing the catechol group molecules. In one embodiment, the liquid is at a temperature in the range of 70-120 Celsius when the panel is immersed in the liquid, but the liquid may be at other temperatures in other embodiments. During the immersion, the benzene rings of the catechol group molecules react with the molecules of the substrate to chemically bond to the material of the substrate. However, the promoter may be applied by other methods. In some embodiment, the solution is alkaline with a PH of 6 to 9. In other embodiments, the solution may be slightly acidic with a PH of 3 to 6. In some embodiments where each substrate has multiple structures made of different materials at its surface, the substrate may be dipped in multiple solutions of different PH levels, of different catechol group molecules, and/or of other different substances so that the benzene rings chemically bond effectively to the different materials of the substrate.

In process 305, the die (or other electronic component) is attached to the substrate. In process 307, the die is electrically coupled to the substrate (e.g. by wirebonding). In some embodiments such as with some flip chip configurations, processes 305 and 307 are performed at the same time where the die is electrically coupled when attached to the substrate.

In process 309, the substrate and die are encapsulated with an encapsulant. In one embodiment, the encapsulant is applied by a transfer molding process. However, in other embodiments, the encapsulant may be formed by other encapsulating processes e.g. by a compression molding process. The encapsulation process typically includes the application of heat to the encapsulating assembly. During the encapsulating process, the encapsulant molecules chemically react with the catechol adhesion promoter bonded to the substrate surface to form chemical bonds. As a result, the encapsulant is chemically bonded to material of the substrate with the benzene rings of the catechol adhesion promoted interface.

After the encapsulating process, the encapsulated substrate panel is singulated into multiple packaged devices, e.g. with a saw or laser. In some embodiments, solder balls maybe added to the panel before singulation.

Figure 4:
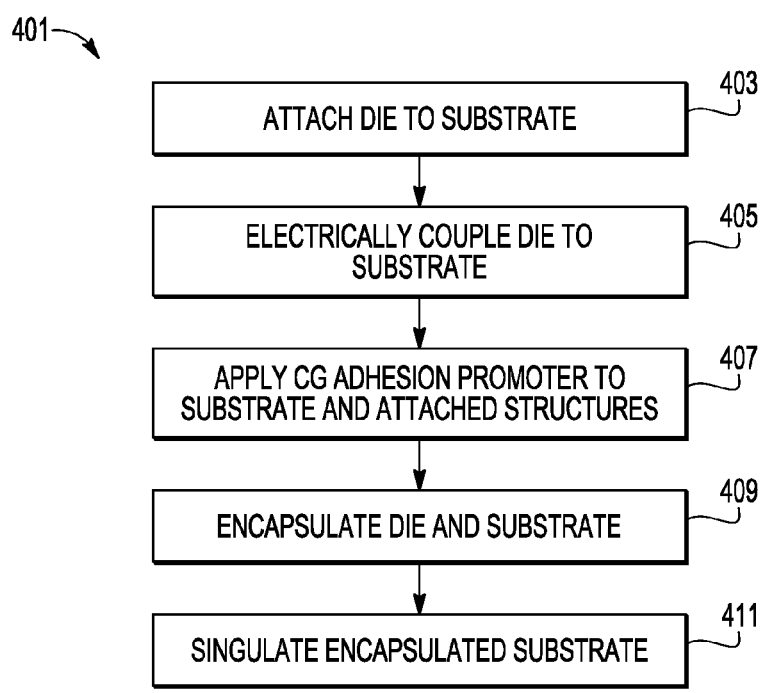
FIG. 4 is a flow chart for forming a packaged electronic device according to another embodiment of the present invention.

FIG. 4 sets forth a flow diagram 401 for making a packaged electronic device similar to device 201. The processes of FIG. 4 is similar to the processes of FIG. 3 except that the catechol group adhesion promoter is applied to the substrate (in process 407) after the attachment of the die to the substrate (in process 403) and the attachment of wire bonds (in process 405). Accordingly, the material formed by the application of the adhesion promoter is attached to the wire bonds and die as well as to exposed surfaces of the substrate. Processes 409 and 411 are similar to processes 309 and 311 in the embodiment of FIG. 3.

In other embodiments, the catechol group adhesion promoter is applied after attachment of the die to the substrate (process 403) but before wire bonding (process 405).

In one embodiment, applying a catechol group adhesion promoter to a surface of a substrate prior to encapsulation of the surface of the substrate acts to increase the bond strength between the surface of the substrate and the encapsulant. The catechol group adhesion promoter acts to form molecules each with a benzene ring that is chemically bonded to material of the encapsulant and to material of the substrate. This may be especially important for substrates having an encapsulating surface that is metal (e.g. copper, silver plated copper, nickel palladium gold, gold palladium, or gold). Without the adhesion promoter, it may be difficult to form chemical bonds between the encapsulant and metal.

The chemical bonds formed by the use of the adhesion promoter increase the bond strength between the encapsulant and substrate. Providing increased bond strength between the encapsulant and substrate may enable a higher reliability of the package which is important in high temperature, high humidity applications such as in automotive or industrial applications. In some embodiments, the encapsulant remains bonded to the substrate at temperatures ranging from −80 to 300 degrees Celsius.

With applying the promoter to the substrate, the ingredients of the promoter can be tailored to the surface materials of the substrate to increase the bond strength between the benzene rings and the substrate. Also, by applying the adhesion promoter to the surface of the substrate, the surface can be more consistently coated with molecules having free hydroxyls, which provide for a better surface for subsequent encapsulation.

In one embodiment, a method comprises attaching an electronic component to a package substrate and encapsulating a surface of the package substrate with an encapsulant. Prior to the encapsulating, an adhesion promoter is applied to the surface. The adhesion promoter includes catechol group molecules.

In another embodiment, a packaged electronic device includes a package substrate, an electronic component attached to the package substrate, and an encapsulant bonded to a portion of the package substrate at a catechol group adhesion promoted interface that includes a plurality of benzene rings bonded with the package substrate and the encapsulant.

In another embodiment, a packaged electronic device includes a package substrate including a surface, an encapsulant encapsulating the surface, and a self assembled monolayer interface between the surface and the encapsulant. The self assembled monolayer interface including a plurality of molecules each including a benzene ring chemically bonded to the surface and to the encapsulant.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A packaged electronic device, comprising:
   a package substrate;
   a catechol group adhesion promoter applied to the package substrate;
   an electronic component attached to the package substrate, a first catechol group adhesion promoted interface formed between the electronic component and the package substrate;
   an encapsulant bonded to a portion of the package substrate at a second catechol group adhesion promoted interface formed between the package substrate and the encapsulant.

2. The device of claim 1, wherein the adhesion promoted interfaces include a plurality of benzene rings chemically bonded to a surface of the package substrate.

3. The device of claim 2, wherein at least some of the plurality of benzene rings are chemically bonded to the encapsulant.

4. The device of claim 1, further comprising:
   a catechol group molecule between the encapsulant and the package substrate.

5. The device of claim 4, wherein the catechol group molecule is characterized as one of a group consisting of dihydroxybenzene, dopamine, alpha-methyldopamine, norepinephrine, dihydroxyphenylalanine, alpha-methyldopa, droxidopa, and 5-hydroxydopamine.

6. The device of claim 1, wherein the encapsulant remains bonded to the package substrate at temperatures ranging between −80 degrees Celsius and 300 degrees Celsius.

7. The device of claim 1 wherein the second catechol group adhesion promoted interface is located at a metal surface of the package substrate.

8. The device of claim 1, further comprising:
   a plurality of wire bonds electrically coupling the electronic component and the package substrate, wherein the encapsulant is located on surfaces of the plurality of wire bonds.

9. The device of claim 1 wherein the first and second catechol group adhesion promoted interfaces are characterized as a self assembled monolayer interface.

10. A packaged electronic device, comprising:
    a package substrate including a surface;
    an electronic device attached to a portion of the surface;
    an encapsulant encapsulating the surface;
    a self assembled monolayer interface formed between the surface and the encapsulant and formed between the portion of the surface and the electronic device, the self assembled monolayer interface including a plurality of molecules each including a benzene ring chemically bonded to the surface and to the encapsulant.

11. The packaged electronic device of claim 10 wherein the surface is characterized as a metal.

* * * * *